(12) United States Patent
Koide

(10) Patent No.: US 11,679,956 B2
(45) Date of Patent: Jun. 20, 2023

(54) ELEVATOR SYSTEM INCLUDING A DERAILMENT CONTACT

(71) Applicant: Mitsubishi Electric Corporation, Chiyoda-ku (JP)

(72) Inventor: Kazuaki Koide, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 1193 days.

(21) Appl. No.: 16/083,961

(22) PCT Filed: May 17, 2016

(86) PCT No.: PCT/JP2016/064593
§ 371 (c)(1),
(2) Date: Sep. 11, 2018

(87) PCT Pub. No.: WO2017/199332
PCT Pub. Date: Nov. 23, 2017

(65) Prior Publication Data
US 2019/0084805 A1    Mar. 21, 2019

(51) Int. Cl.
*B66B 5/00*  (2006.01)
*B66B 7/12*  (2006.01)
(Continued)

(52) U.S. Cl.
CPC .......... *B66B 5/0087* (2013.01); *B66B 5/0031* (2013.01); *B66B 5/02* (2013.01); *B66B 7/1246* (2013.01); *G01R 31/54* (2020.01)

(58) Field of Classification Search
CPC .................... B66B 5/00; B66B 5/0006; B66B 5/0018–0031; B66B 5/02–022
See application file for complete search history.

(56) References Cited

U.S. PATENT DOCUMENTS 4,643,276 A * 2/1987 Philobos ................. B66B 5/022
187/278
9,033,113 B2 * 5/2015 Winey .................... B66B 5/022
187/391
(Continued)

FOREIGN PATENT DOCUMENTS

WO    WO 2011/010376 A1    1/2011

OTHER PUBLICATIONS

International Search Report dated Aug. 16, 2016 in PCT/JP2016/064593 filed May 17, 2016.

*Primary Examiner* — Christopher Uhlir
(74) *Attorney, Agent, or Firm* — Oblon, McClelland, Maier & Neustadt, L.L.P.

(57) ABSTRACT

An elevator system that can check a function of detecting derailment of an elevating body without disconnecting the elevating body from a guide rail. The elevator system includes a conductive wire that is provided along a guide rail, a contact that is attached to the elevating body, and is configured to come into contact with the conductive wire in the case where the elevating body is disconnected from the guide rail, a control panel that is configured to detect electrical conduction between the conductive wire and the contact, and an inspection contact that is attached to a preset position of the conductive wire, and is disposed at a position that allows the inspection contact to come into contact with the contact in the case where the contact moves to the preset position.

5 Claims, 3 Drawing Sheets

(51) Int. Cl.
 *B66B 5/02* (2006.01)
 *G01R 31/54* (2020.01)

(56) References Cited

U.S. PATENT DOCUMENTS

2010/0154527 A1\* 6/2010 Ilian ................ B66B 5/0093
 73/121
2012/0024636 A1\* 2/2012 Niikawa ............. B66B 5/02
 187/391

\* cited by examiner

ELEVATOR SYSTEM INCLUDING A DERAILMENT CONTACT

TECHNICAL FIELD

The present invention relates to an elevator system.

BACKGROUND ART

A system for detecting disconnection of an elevating body of an elevator from a guide rail is conventionally known. The derailment of the elevating body is detected based on contact between a conductive wire provided along the guide rail and a contact attached to the elevating body. An example of such a system includes a system described in PTL 1 shown below.

CITATION LIST

Patent Literature

[PTL 1] WO 2011/010376

SUMMARY OF INVENTION

Technical Problem

When the operation test of the above system is performed, it is necessary to actually bring the conductive wire and the contact into contact with each other. However, it is difficult to disconnect the elevating body from the guide rail after the elevator is installed. Consequently, in the above system, it is not possible to check the function of detecting the derailment of the elevating body.

The present invention has been made in order to solve the above problem. An object thereof is to provide an elevator system capable of checking the function of detecting derailment of an elevating body without disconnecting the elevating body from a guide rail.

Solution to Problem

The elevator system according to the present invention is an elevator system including: a conductive wire provided along a guide rail for guiding movement of an elevating body of an elevator; a contact having conductivity, the contact being attached to the elevating body and configured to come into contact with the conductive wire in a case where the elevating body is disconnected from the guide rail; a control panel electrically connected to the conductive wire and being configured to detect electrical conduction between the conductive wire and the contact; and an inspection contact having conductivity, the inspection contact being attached to a preset position of the conductive wire and disposed at a position that allows the inspection contact to come into contact with the contact in a case where the contact moves to the preset position.

Advantageous Effects of Invention

In the elevator system according to the present invention, the control panel detects the electrical conduction between the conductive wire and the contact. The inspection contact is attached to the preset position of the conductive wire, and is disposed at the position that allows the inspection contact to come into contact with the contact in the case where the contact moves to the preset position. Consequently, according to the present invention, it is possible to check the function of detecting the derailment of the elevating body without disconnecting the elevating body from the guide rail.

DESCRIPTION OF EMBODIMENT

Figure 1:
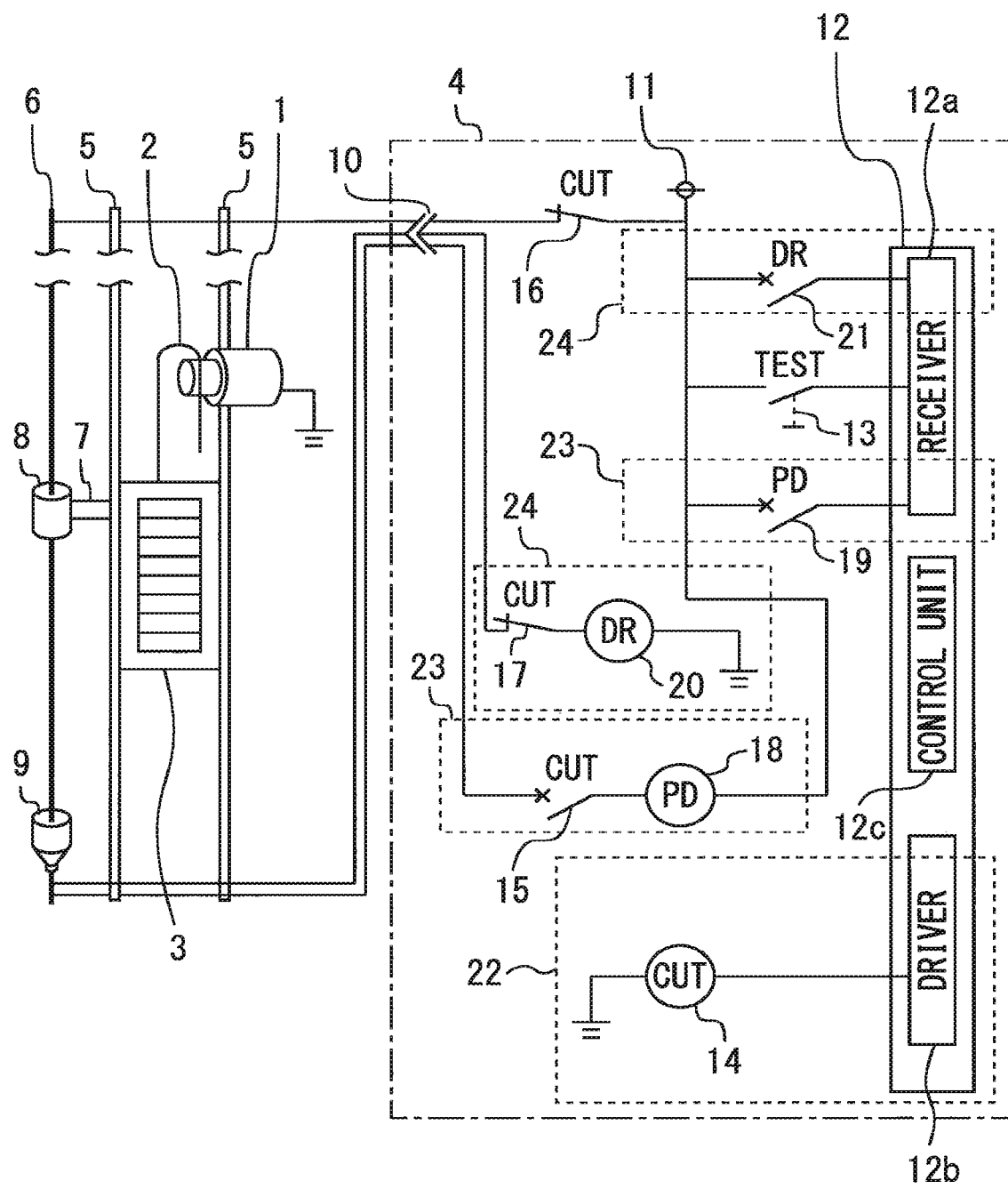
FIG. 1 is a configuration diagram showing an example of an elevator system in Embodiment 1 of the present invention.

The present invention will be described in detail with reference to the accompanying drawings. In the drawings, the same or corresponding parts are designated by the same reference numerals. The repeated description thereof will be appropriately simplified or omitted.

Embodiment 1

FIG. 1 is a configuration diagram showing an example of an elevator system in Embodiment 1.

As shown in FIG. 1, the elevator system includes a hoist 1, a main rope 2, a counterweight 3, and a control panel 4. The elevator system includes a car that is not shown. The main rope 2 is wound around the hoist 1. The car and the counterweight 3 are hung in a hoistway that is not shown by the main rope 2. The hoistway is formed so as to pass through, for example, the individual floors of a building that is not shown. Each of the car and the counterweight 3 serving as elevating bodies of an elevator moves up and down by driving the hoist 1. The control panel 4 has the function of controlling the hoist 1.

A pair of guide rails 5 and a conductive wire 6 are provided in the hoistway. The guide rails 5 are provided, for example, vertically. The guide rails 5 guide upward and downward movement of the counterweight 3. The conductive wire 6 is stretched in parallel along the longitudinal direction of the guide rail 5.

A contact 8 is attached to the frame of the counterweight 3 via a support 7. The contact 8 is formed, for example, tubularly. The contact 8 is provided so as to surround the conductive wire 6 when viewed in a vertical direction. That is, the conductive wire 6 passes through the contact 8. In a usual state, the contact 8 is disposed at a position that prevents the contact 8 from coming into contact with the conductive wire 6. The contact 8 is disposed at a position that allows the contact 8 to come into contact with the conductive wire 6 in the case where the counterweight 3 is disconnected from the guide rails 5. The shape of the contact 8 when viewed in the vertical direction may be circular or polygonal.

An inspection contact 9 can be attached to the conductive wire 6. One of the upper portion and the lower portion of the inspection contact 9 is formed into, for example, a tubular shape similar to the shape of the contact 8. The other one of the upper portion and the lower portion of the inspection contact 9 is formed into, for example, a shape that allows the inspection contact 9 to be fixed in a state in which the inspection contact 9 is in contact with the conductive wire 6.

At least the surface of each of the main rope 2, the frame of the counterweight 3, the conductive wire 6, the support 7, the contact 8, and the inspection contact 9 is formed of a material having conductivity. That is, the contact 8 is electrically connected to the hoist 1 via the support 7, the frame of the counterweight 3, and the main rope 2. The inspection contact 9 attached to the conductive wire 6 is electrically connected to the conductive wire 6.

The conductive wire 6 is electrically connected to the control panel 4 via a connector 10. The conductive wire 6 is electrically connected to the control panel 4 such that an area through which the contact 8 can pass is energized from the control panel 4. Examples of the position of connection with the control panel 4 in the conductive wire 6 include a position above the contact 8 when the car is stopped at the bottom floor, and a position below the contact 8 when the car is stopped at the top floor.

As shown in FIG. 1, the control panel 4 has a power supply device 11, an input/output board 12, and a test switch 13. The input/output board 12 has a receiver 12a, a driver 12b, and a control unit 12c. The test switch 13 is, for example, a push-button switch. The test switch 13 is, for example, a spring-back switch.

As shown in FIG. 1, the control panel 4 has a relay CUT, a relay PD, and a relay DR. The relay CUT has a coil 14, a make contact 15, a break contact 16, and a break contact 17. The relay PD has a coil 18 and a make contact 19. The relay DR has a coil 20 and a make contact 21. The break contact 16 of the relay CUT is provided between the power supply device 11 and the connector 10.

As shown in FIG. 1, the control panel 4 has a first diagnosis unit 22, a second diagnosis unit 23, and a third diagnosis unit 24. The first diagnosis unit 22 includes the driver 12b and the coil 14 of the relay CUT. The second diagnosis unit 23 includes the make contact 15 of the relay CUT, the coil 18 of the relay PD, the make contact 19 of the relay PD, and the receiver 12a. The third diagnosis unit 24 includes the break contact 17 of the relay CUT, the coil 20 of the relay DR, the make contact 21 of the relay DR, and the receiver 12a.

In the elevator system shown in FIG. 1, parts corresponding to the power supply device 11, the conductive wire 6, the contact 8, the support 7, the counterweight 3, the main rope 2, the hoist 1, and the third diagnosis unit 24 function as a derailment detection circuit. Hereinafter, the operation of the derailment detection circuit will be described.

In the case where the elevator is operated normally, the break contact 16 and the break contact 17 of the relay CUT are closed, and hence the conductive wire 6 is energized. In this case, voltage is applied to the coil 20 of the relay DR, and hence the make contact 21 is closed. When the make contact 21 is closed, a derailment detection signal DR is inputted to the receiver 12a. Hereinafter, inputting of the derailment detection signal DR to the receiver 12a is also expressed as "the derailment detection signal DR is detected by the third diagnosis unit 24".

When the contact 8 is caused to come into contact with the conductive wire 6 by the derailment of the elevating body, current is caused to flow through the hoist 1 from the power supply device 11 via the conductive wire 6, the contact 8, the support 7, the frame of the counterweight 3, and the main rope 2. That is, when the contact 8 comes into contact with the conductive wire 6, a ground fault occurs. In this case, the power supply device 11 stops power supply to the derailment detection circuit by operating an overcurrent protection function. With this, the application of voltage to the coil 20 of the relay DR is stopped, and hence the make contact 21 is opened. That is, when electrical conduction between the contact 8 and the conductive wire 6 is provided, the detection of the derailment detection signal DR by the third diagnosis unit 24 is suspended. Thus, the derailment detection circuit detects the derailment of the elevating body based on the suspension of the detection of the derailment detection signal DR.

Figure 2:
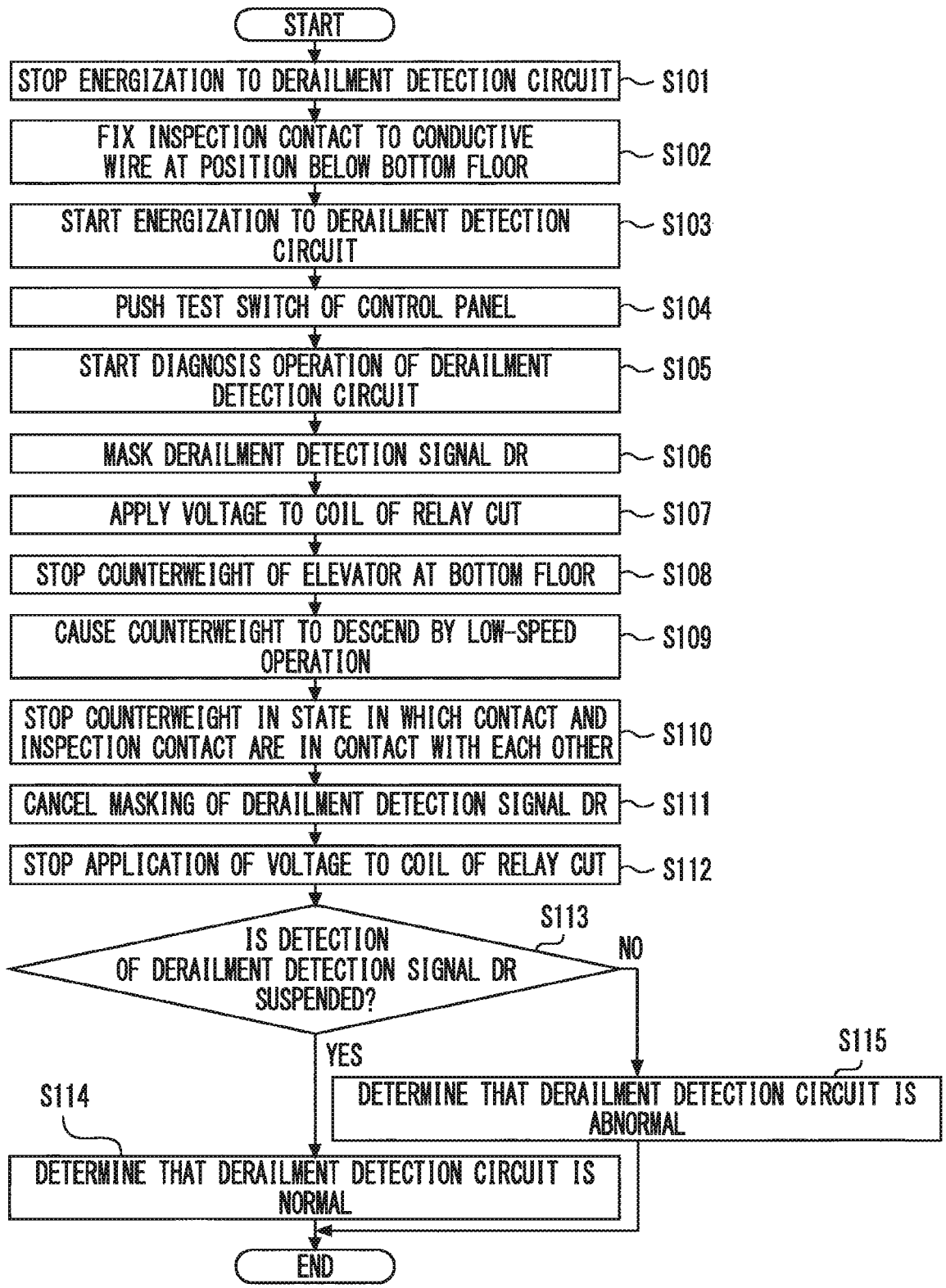
FIG. 2 is a flowchart showing an example of the operation of the elevator system in Embodiment 1 of the present invention.

FIG. 2 is a flowchart showing an example of the operation of the elevator system in Embodiment 1. Hereinafter, with reference to FIG. 2, a diagnosis operation of the derailment detection circuit will be described.

A worker stops energization to the derailment detection circuit from the power supply device 11 (Step S101). Subsequently to Step S101, the worker fixes the inspection contact 9 to the conductive wire 6 at a preset position below the bottom floor (Step S102). That is, the worker attaches the inspection contact 9 to the conductive wire 6 when the operation of the elevator is stopped and the derailment detection circuit is not in a live state. Note that the position of attachment of the inspection contact 9 is above the position of connection with the control panel 4 in the conductive wire 6.

Subsequently to Step S102, the worker starts the energization to the derailment detection circuit from the power supply device 11 (Step S103). Subsequently to Step S103, the worker pushes the test switch 13 of the control panel 4 (Step S104). When the test switch 13 is pushed, the control panel 4 starts the diagnosis operation of the derailment detection circuit (Step S105).

When the diagnosis operation of the derailment detection circuit is started, the control unit 12c masks the derailment detection signal DR (Step S106). The driver 12b of the input/output board 12 outputs a signal, and applies voltage to the coil 14 of the relay CUT (Step S107).

In Step S107, the first diagnosis unit 22 stops energization to the conductive wire 6. In Step S107, the first diagnosis unit 22 breaks the circuit of the third diagnosis unit 24. In Step S107, the first diagnosis unit 22 makes the circuit of the second diagnosis unit 23.

Subsequently to Step S107, the control unit 12c stops the counterweight 3 of the elevator at the bottom floor by an automatic operation (Step S108). Subsequently to Step S108, the control unit 12c starts to cause the counterweight 3 to descend by a low-speed operation (Step S109).

When the counterweight 3 descends from the bottom floor, the contact 8 comes into contact with the inspection contact 9. When the contact 8 comes into contact with the inspection contact 9, current is caused to flow through the hoist 1 from the power supply device 11 via the coil 18 of the relay PD, the make contact 15 of the relay CUT, the conductive wire 6, the inspection contact 9, the contact 8, the support 7, the frame of the counterweight 3, and the main rope 2. That is, in the diagnosis operation of the derailment detection circuit, when the contact 8 comes into contact with the inspection contact 9, voltage is applied to the coil 18 of the relay PD. When the voltage is applied to the coil 18 of the relay PD, the make contact 19 of the relay PD is closed. When the make contact 19 is closed, the signal PD is inputted to the receiver 12a of the input/output board 12. That is, the second diagnosis unit 23 detects the contact of the contact 8 with the inspection contact 9 in a state in which the energization to the conductive wire 6 is stopped.

When the signal PD is inputted to the input/output board 12, the control unit 12c stops the counterweight 3. That is, the control unit 12c stops the counterweight 3 in a state in which the contact 8 and the inspection contact 9 are in contact with each other (Step S110). Subsequently to Step S110, the control unit 12c cancels the masking of the derailment detection signal DR (Step S111). Subsequently to Step S111, the driver 12b of the input/output board 12 stops the output of the signal, and stops the application of voltage to the coil 14 of the relay CUT (Step S112).

In Step S112, the first diagnosis unit 22 breaks the circuit of the second diagnosis unit 23. In Step S112, the first diagnosis unit 22 makes the circuit of the third diagnosis unit 24. In Step S112, the first diagnosis unit 22 starts the energization to the conductive wire 6.

As the result in Step S112, current is caused to flow through the hoist 1 from the power supply device 11 via the conductive wire 6, the inspection contact 9, the contact 8, the support 7, the frame of the counterweight 3, and the main rope 2. That is, as the result in Step S112, an energization state similar to that in the case where the derailment has occurred is created artificially.

Subsequently to Step S112, the control unit 12c determines whether or not the detection of the derailment detection signal DR by the third diagnosis unit 24 is suspended (Step S113). The suspension of the detection of the derailment detection signal DR means that power supply to the derailment detection circuit is stopped by the overcurrent protection function of the power supply device 11. Continuation of the detection of the derailment detection signal DR means that the overcurrent protection function of the power supply device 11 does not operate properly. That is, the third diagnosis unit 24 checks the derailment detection circuit based on the presence or absence of the derailment detection signal DR in a state in which the energization to the conductive wire 6 is resumed by the first diagnosis unit 22 after the contact of the contact 8 with the inspection contact 9 is detected by the second diagnosis unit 23.

In the case where it is determined that the detection of the derailment detection signal DR is suspended in Step S113, the control unit 12c determines that the derailment detection circuit is normal (Step S114). In this case, the worker stops the energization to the derailment detection circuit, and disconnects the inspection contact 9 from the conductive wire 6.

In the case where it is determined that the detection of the derailment detection signal DR is continued in Step S113, the control unit 12c determines that the derailment detection circuit is abnormal (Step S115). In this case, the control unit 12c stops the elevator after moving the car to the nearest floor.

In Embodiment 1, the contact 8 attached to the elevating body is disposed at the position that allows the contact 8 to come into contact with the conductive wire 6 in the case where the elevating body is disconnected from the guide rails 5. The control panel 4 is electrically connected to the conductive wire 6, and detects electrical conduction between the conductive wire 6 and the contact 8. The inspection contact 9 is attached to the preset position of the conductive wire 6. The inspection contact 9 is disposed at the position that allows the inspection contact 9 to come into contact with the contact 8 in the case where the contact 8 moves to the preset position. Consequently, according to Embodiment 1, it is possible to provide the electrical conduction between the conductive wire 6 and the contact 8 via the inspection contact 9. As a result, it is possible to check the function of detecting the derailment of the elevating body without disconnecting the elevating body from the guide rails.

In Embodiment 1, the first diagnosis unit 22 starts and stops the energization to the conductive wire 6. The second diagnosis unit 23 detects the contact of the contact 8 with the inspection contact 9 in the state in which the energization to the conductive wire 6 is stopped by the first diagnosis unit 22. The third diagnosis unit 24 checks the derailment detection circuit including the conductive wire 6 and the contact 8 in the state in which the energization to the conductive wire 6 is started by the first diagnosis unit 22 after the contact of the contact 8 with the inspection contact 9 is detected by the second diagnosis unit 23. Consequently, according to Embodiment 1, it is possible to artificially create the energization state similar to that in the case where the derailment has occurred. As a result, it is possible to check the function of detecting the derailment of the elevating body without disconnecting the elevating body from the guide rails.

In Embodiment 1, the control panel 4 automatically moves the elevating body in the state in which the energization to the conductive wire 6 is stopped by the first diagnosis unit 22. The control panel 4 stops the elevating body when the contact of the contact 8 with the inspection contact 9 is detected by the second diagnosis unit 23. Consequently, according to Embodiment 1, the position of the elevating body of the elevator is automatically adjusted such that the contact 8 and the inspection contact 9 come into contact with each other. As a result, it is possible to increase the efficiency of the check operation of the function of detecting the derailment of the elevating body. In addition, according to Embodiment 1, when the conductive wire 6 is in the live state, the contact 8 and the inspection contact 9 don't come into contact with each other. As a result, it is possible to prevent the derailment detection circuit from being damaged by the occurrence of an arc.

In Embodiment 1, the conductive wire 6, the contact 8, and the inspection contact 9 may be provided for each guide rail 5. That is, for example, two conductive wires 6, two contacts 8, and two inspection contacts 9 may be provided. Even in this case, it is possible to check the function of detecting the derailment of the elevating body by the same method.

In Embodiment 1, the elevating body serving as the target of the derailment detection may be the car instead of the counterweight 3. In Embodiment 1, the position at which the inspection contact 9 is fixed to the conductive wire 6 may be, for example, a preset position above the top floor and below the position of connection with the control panel 4 in the conductive wire 6. In this case as well, it is possible to check the function of detecting the derailment of the elevating body by the same method.

Figure 3:
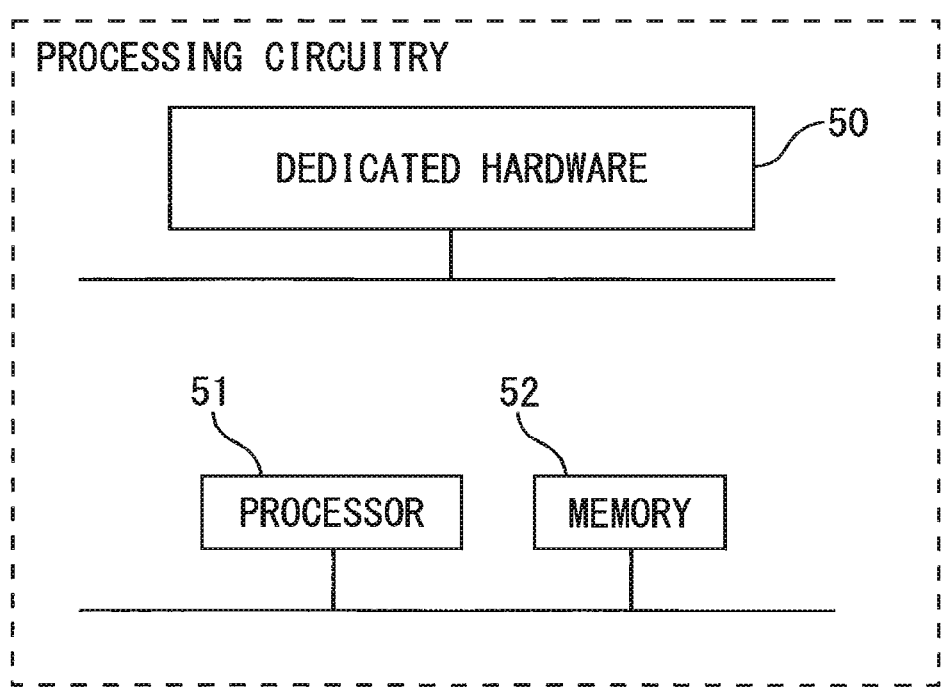
FIG. 3 is a hardware configuration diagram of a control panel.

FIG. 3 is a hardware configuration diagram of the control panel.

The individual functions of the receiver 12a, the driver 12b, and the control unit 12c in the control panel 4 are implemented by processing circuitry. The processing circuitry may be dedicated hardware 50. The processing circuitry may include a processor 51 and a memory 52. Part of the processing circuitry may be formed as the dedicated hardware 50, and the processing circuitry may further include the processor 51 and the memory 52. FIG. 3 shows an example in the case where part of the processing circuitry is formed as the dedicated hardware 50, and the processing circuitry includes the processor 51 and the memory 52.

In the case where at least part of the processing circuitry is at least one dedicated hardware 50, the processing circuitry corresponds to, for example, a single circuit, a composite circuit, a programmed processor, a parallel-programmed processor, an ASIC, an FPGA, or a combination thereof.

In the case where the processing circuitry includes at least one processor 51 and at least one memory 52, the individual functions of the receiver 12a, the driver 12b, and the control unit 12c are implemented by software, firmware, or a combination of software and firmware. The software and the firmware are described as programs, and the programs are stored in the memory 52. The processor 51 implements the functions of the individual units by reading and executing the programs stored in the memory 52. The processor 51 is also referred to as a CPU (Central Processing Unit), a central processor, a processing unit, an arithmetic unit, a microprocessor, a microcomputer, or a DSP. The memory 52 corresponds to, for example, a non-volatile or volatile semiconductor memory such as a RAM, a ROM, a flash memory, an EPROM, or an EEPROM, a magnetic disk, a flexible disk, an optical disk, a compact disc, a minidisc, or a DVD.

Thus, the processing circuitry can implement the individual functions of the control panel 4 by the hardware, the software, the firmware, or the combination thereof.

INDUSTRIAL APPLICABILITY

Thus, the present invention can be applied to the elevator.

REFERENCE SIGNS LIST

1 Hoist
2 Main rope
3 Counterweight
4 Control panel
5 Guide rail
6 Conductive wire
7 Support
8 Contact
9 Inspection contact
10 Connector
11 Power supply device
12 Input/output board
12a Receiver
12b Driver
12c Control unit
13 Test switch
14 Coil
15 Make contact
16 Break contact
17 Break contact
18 Coil
19 Make contact
20 Coil
21 Make contact
22 First diagnosis unit
23 Second diagnosis unit
24 Third diagnosis unit.

The invention claimed is:

1. An elevator system comprising:
a conductive wire provided along a guide rail for guiding movement of an elevating body of an elevator;
a contact having conductivity, the contact being attached to the elevating body and configured to come into contact with the conductive wire in a case where the elevating body is disconnected from the guide rail;
a control panel electrically connected to the conductive wire and configured to detect electrical conduction between the conductive wire and the contact; and
an electrically conductive inspection contact being directly attached to and in contact with the conductive wire at a preset position on the conductive wire,
wherein the electrically conductive inspection contact is disposed at a position that allows the electrically conductive inspection contact to come into contact with the contact in response to the contact moving to the preset position.

2. The elevator system according to claim 1, further comprising:
a first diagnosis unit provided in the control panel and configured to start and stop energization to the conductive wire;
a second diagnosis unit provided in the control panel and configured to detect that the contact has contacted with the electrically conductive inspection contact in a state in which the energization to the conductive wire is stopped by the first diagnosis unit; and
a third diagnosis unit provided in the control panel and configured to check a derailment detection circuit including the conductive wire and the contact in a state in which the energization to the conductive wire is started by the first diagnosis unit after contact of the contact with the electrically conductive inspection contact is detected by the second diagnosis unit.

3. The elevator system according to claim 2, wherein the control panel automatically moves the elevating body in a state in which the energization to the conductive wire is stopped by the first diagnosis unit, and stops the elevating body when contact of the contact with the electrically conductive inspection contact is detected by the second diagnosis unit.

4. The elevator system according to claim 1, wherein the contact and one of the upper portion and the lower portion of the electrically conductive inspection contact are formed into a tubular shape, and
the other one of the upper portion and the lower portion of the electrically conductive inspection contact is formed into a shape that allows the electrically conductive inspection contact to be fixed in a state in which the electrically conductive inspection contact is in contact with the conductive wire.

5. The elevator system according to claim 1, wherein the contact is electrically connected to a hoist of the elevator via a support portion of the contact, a frame of the elevating body, and a main rope of the elevator.

* * * * *